(12) United States Patent
Lee et al.

(10) Patent No.: US 10,396,277 B2
(45) Date of Patent: Aug. 27, 2019

(54) MAGNETIC MEMORY DEVICES

(71) Applicant: Samsung Electronics Co., Ltd., Suwon-si, Gyeonggi-do (KR)

(72) Inventors: Woohyun Lee, Hwaseong-si (KR); Sang-Kuk Kim, Seongnam-si (KR); Oik Kwon, Yongin-si (KR); Inho Kim, Suwon-si (KR); Jongchul Park, Seongnam-si (KR); Kwangyoung Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/970,963

(22) Filed: May 4, 2018

(65) Prior Publication Data

US 2019/0165257 A1 May 30, 2019

(30) Foreign Application Priority Data

Nov. 29, 2017 (KR) .......................... 10-2017-0161931

(51) Int. Cl.
*H01L 43/08* (2006.01)
*H01F 10/32* (2006.01)
*H01L 43/02* (2006.01)
*G11C 11/16* (2006.01)
*H01L 27/22* (2006.01)
(Continued)

(52) U.S. Cl.
CPC ............ *H01L 43/08* (2013.01); *G11C 11/161* (2013.01); *H01F 10/329* (2013.01); *H01F 10/3254* (2013.01); *H01F 10/3286* (2013.01); *H01L 27/1087* (2013.01); *H01L 27/222* (2013.01); *H01L 43/02* (2013.01); *H01L 43/10* (2013.01)

(58) Field of Classification Search
CPC ....... H01L 27/222; H01L 43/12; H01L 43/08; H01L 43/02; H01L 43/10; G11C 11/161
See application file for complete search history.

(56) References Cited

U.S. PATENT DOCUMENTS 6,198,608 B1 3/2001 Hong et al.
9,105,572 B2 8/2015 Kanaya et al.
(Continued)

FOREIGN PATENT DOCUMENTS

JP 2003-196807 A 7/2003
JP 2013-201343 A 10/2013

*Primary Examiner* — Ahmed N Sefer
(74) *Attorney, Agent, or Firm* — Harness, Dickey & Pierce, P.L.C.

(57) ABSTRACT

A magnetic memory device includes a lower interlayer insulating layer on a substrate, and a plurality of magnetic tunnel junction patterns on the lower interlayer insulating layer and isolated from direct contact with each other in a direction extending parallel to a top surface of the substrate. The lower interlayer insulating layer includes an upper surface including a recessed surface and a top surface, the recessed surface at least partially defining an inner sidewall and a bottom surface of a recess region between adjacent magnetic tunnel junction patterns, such that the recessed surface at least partially defines the recess region. The inner sidewall is inclined at an acute angle with respect to the top surface of the substrate, and the bottom surface has a shape that is convex toward the top surface of the substrate, in direction extending perpendicular to the top surface of the substrate.

20 Claims, 13 Drawing Sheets

(51) Int. Cl.
*H01L 27/108* (2006.01)
*H01L 43/10* (2006.01)

(56) References Cited

U.S. PATENT DOCUMENTS

| | | |
|---|---|---|
| 9,608,040 B2 | 3/2017 | Baek et al. |
| 9,647,033 B2 | 5/2017 | Shin et al. |
| 9,735,349 B2 | 8/2017 | Park et al. |
| 9,818,935 B2 | 11/2017 | Chuang et al. |
| 2016/0218280 A1* | 7/2016 | Park ........................ H01L 43/12 |
| 2017/0076769 A1 | 3/2017 | Shirotori et al. |
| 2017/0092851 A1 | 3/2017 | Han et al. |
| 2017/0345869 A1* | 11/2017 | Park ...................... H01L 27/222 |

* cited by examiner

MAGNETIC MEMORY DEVICES

CROSS-REFERENCE TO RELATED APPLICATION

This U.S. non-provisional patent application claims priority under 35 U.S.C. § 119 to Korean Patent Application No. 10-2017-0161931, filed on Nov. 29, 2017, in the Korean Intellectual Property Office, the disclosure of which is hereby incorporated by reference in its entirety.

BACKGROUND

Example embodiments of the inventive concepts relate to magnetic memory devices and, more particularly, to magnetic memory devices including magnetic tunnel junctions.

As high-speed and/or low power consumption electronic devices are in relatively high demand, high-speed and/or low-voltage semiconductor memory devices used therein have also been demanded. Magnetic memory devices have been developed as semiconductor memory devices capable of satisfying this demand. The magnetic memory devices may emerge as next-generation semiconductor memory devices because of their high-speed and/or non-volatile characteristics.

In general, a magnetic memory device may include a magnetic tunnel junction (MTJ) pattern. The magnetic tunnel junction pattern may include two magnetic layers and an insulating layer between the two magnetic layers. A magnitude of a resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively high ("great") resistance value. When the magnetization directions of the two magnetic layers are parallel to each other, the magnetic tunnel junction pattern may have a relatively low ("small") resistance value. The magnetic memory device may read/write data using a difference between the resistance values of the magnetic tunnel junction pattern.

Highly integrated and/or low-power magnetic memory devices have been increasingly demanded with the development of an electronic industry. Thus, various avenues of research are being pursued to satisfy these demands.

SUMMARY

Some example embodiments of the inventive concepts may provide a magnetic memory device with improved electrical characteristics.

In some example embodiments, a magnetic memory device may include a lower interlayer insulating layer on a substrate, and a plurality of magnetic tunnel junction patterns on the lower interlayer insulating layer. The plurality of magnetic tunnel junction patterns may be isolated from direct contact with each other in a first plane extending parallel to a top surface of the substrate. The lower interlayer insulating layer may include an upper surface, the upper surface of the lower interlayer insulating layer including a recessed surface and a top surface, the recessed surface at least partially defining an inner sidewall and a bottom surface of a recess region in the lower interlayer insulating layer between adjacent magnetic tunnel junction patterns of the plurality of magnetic tunnel junction patterns, such that the recessed surface at least partially defines the recess region. The inner sidewall of the recess region may be inclined at an acute angle with respect to the top surface of the substrate, and the bottom surface of the recess region may have a shape that is convex toward the top surface of the substrate, in a plane extending perpendicular to the top surface of the substrate.

In some example embodiments, a magnetic memory device may include a lower interlayer insulating layer on a substrate, and a plurality of data storage structures on the lower interlayer insulating layer. The plurality of data storage structures may be isolated from direct contact with each other in a first plane extending parallel to a top surface of the substrate. Each data storage structure of the plurality of data storage structures may include a bottom electrode pattern on the lower interlayer insulating layer, a magnetic tunnel junction pattern on the bottom electrode pattern, and a top electrode pattern on the magnetic tunnel junction pattern. The lower interlayer insulating layer may include an upper surface, the upper surface of the lower interlayer insulating layer including a recessed surface and a top surface, the recessed surface at least partially defining an inner sidewall and a bottom surface of a recess region in the lower interlayer insulating layer between adjacent data storage structures of the plurality of data storage structures, such that the recessed surface at least partially defines the recess region. The inner sidewall of the recess region may be inclined at an acute angle with respect to the top surface of the substrate, and the bottom surface of the recess region may have a shape that is convex toward the top surface of the substrate, in a plane extending perpendicular to the top surface of the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, example embodiments of the inventive concepts will be described in detail with reference to the accompanying drawings.

Figure 1:
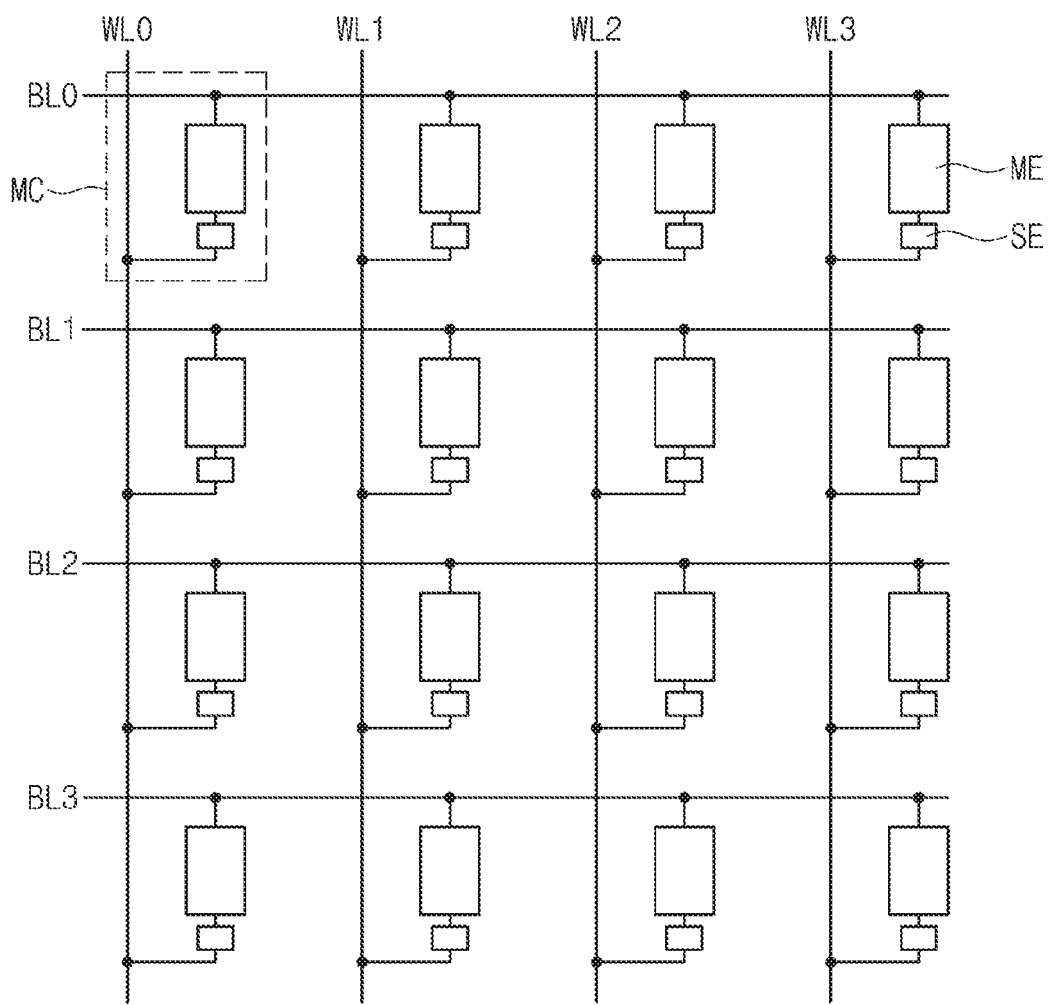
FIG. 1 is a circuit diagram illustrating a memory cell array of a magnetic memory device according to some example embodiments of the inventive concepts.
Figure 2:
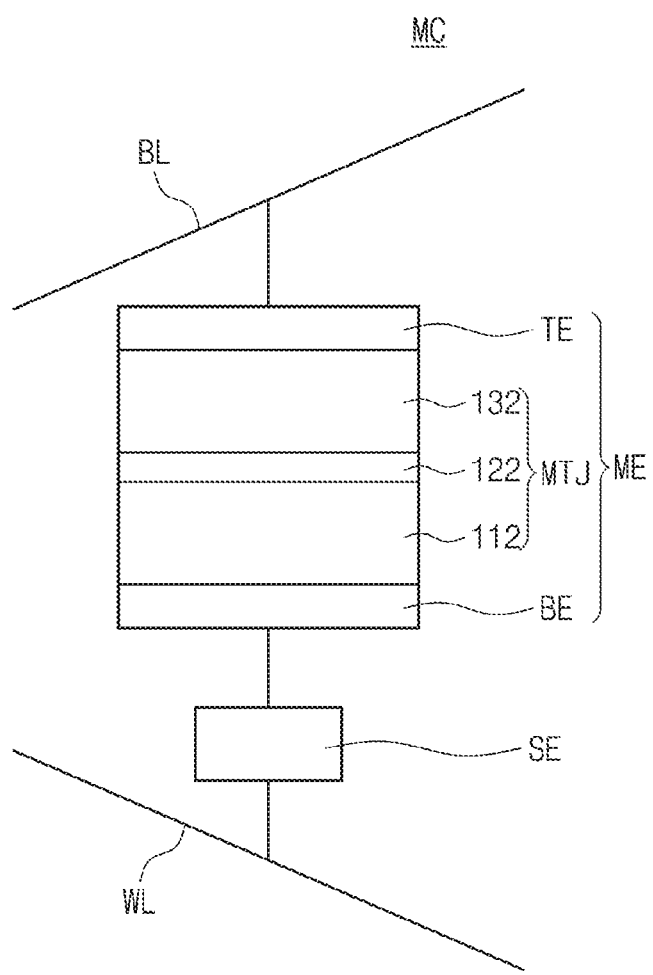
FIG. 2 is a circuit diagram illustrating a unit memory cell of a magnetic memory device according to some example embodiments of the inventive concepts.

FIG. 1 is a circuit diagram illustrating a memory cell array of a magnetic memory device according to some example embodiments of the inventive concepts, and FIG. 2 is a circuit diagram illustrating a unit memory cell of a magnetic memory device according to some example embodiments of the inventive concepts.

Referring to FIG. 1, a memory cell array 10 may include a plurality of word lines WL0 to WL3, a plurality of bit lines BL0 to BL3, and unit memory cells MC. The unit memory cells MC may be two-dimensionally or three-dimensionally arranged. The bit lines BL0 to BL3 may intersect the word lines WL0 to WL3. Each of the unit memory cells MC may be connected to a corresponding one of the word lines WL0 to WL3 and a corresponding one of the bit lines BL0 to BL3. Each of the word lines WL0 to WL3 may be connected to a plurality of the unit memory cells MC. The unit memory cells MC connected to one of the word lines WL0 to WL3 may be connected to the bit lines BL0 to BL3, respectively, and the unit memory cells MC connected to one of the bit lines BL0 to BL3 may be connected to the word lines WL0 to WL3, respectively. Each of the unit memory cells MC connected to one of the word lines WL0 to WL3 may be connected to a read and write circuit through each of the bit lines BL0 to BL3.

Referring to FIG. 2, each of the unit memory cells MC may include a memory element ME and a selection element SE. The memory element ME may be connected between a bit line BL and the selection element SE, and the selection element SE may be connected between the memory element ME and a word line WL. The memory element ME may be a variable resistance element of which a resistance state is switchable between two different resistance states by an electrical pulse applied thereto. The memory element ME may have a thin layer structure of which an electrical resistance is changeable using spin transfer torque of electrons of a program current passing therethrough. The memory element ME may have a thin layer structure showing a magnetoresistance characteristic and may include at least one ferromagnetic material and/or at least one anti-ferromagnetic material. The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line (not shown) may be connected to the selection element SE.

The memory element ME may include a magnetic tunnel junction MTJ. The magnetic tunnel junction MTJ may include a first magnetic pattern 112, a second magnetic pattern 132, and a tunnel barrier pattern 122 disposed between the first and second magnetic patterns 112 and 132. Each of the first and second magnetic patterns 112 and 132 may include at least one magnetic layer formed of a magnetic material. The memory element ME may further include a bottom electrode BE disposed between the magnetic tunnel junction MTJ and the selection element SE, and a top electrode TE disposed between the magnetic tunnel junction MTJ and the bit line BL.

Figure 3:
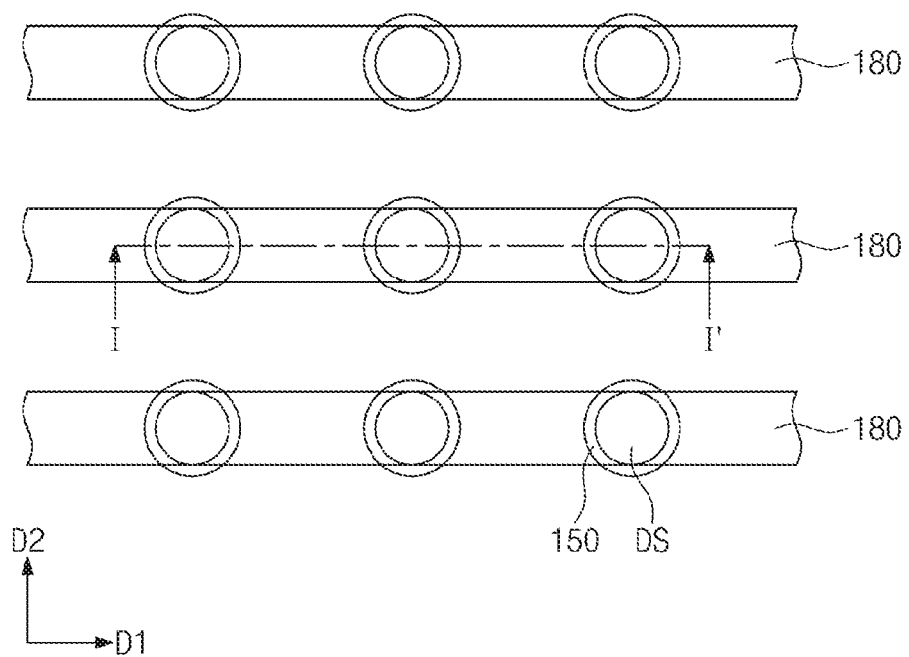
FIG. 3 is a plan view illustrating a magnetic memory device according to some example embodiments of the inventive concepts.
Figure 4:
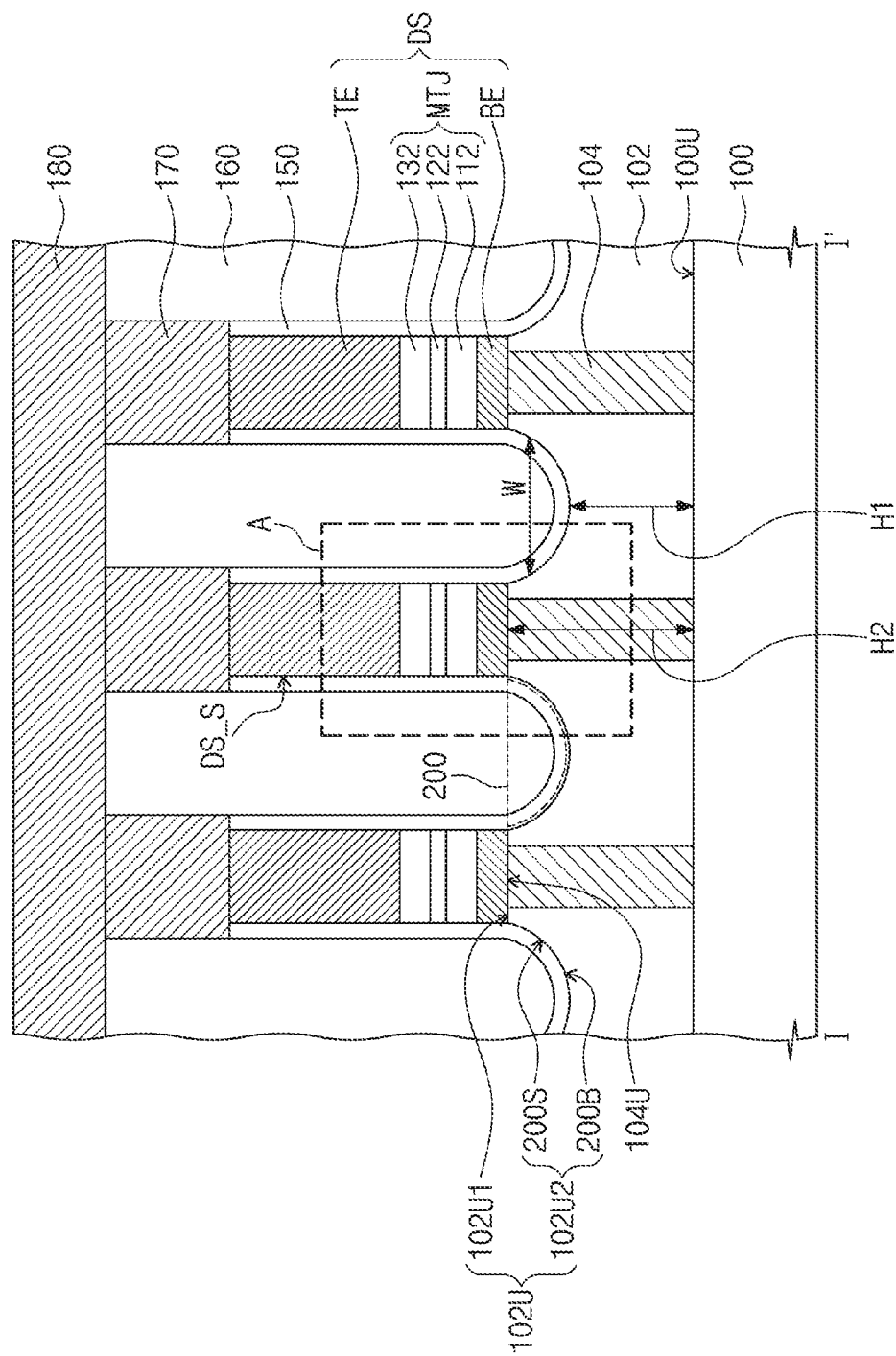
FIG. 4 is a cross-sectional view taken along a line I-I' of FIG. 3.
Figure 5:
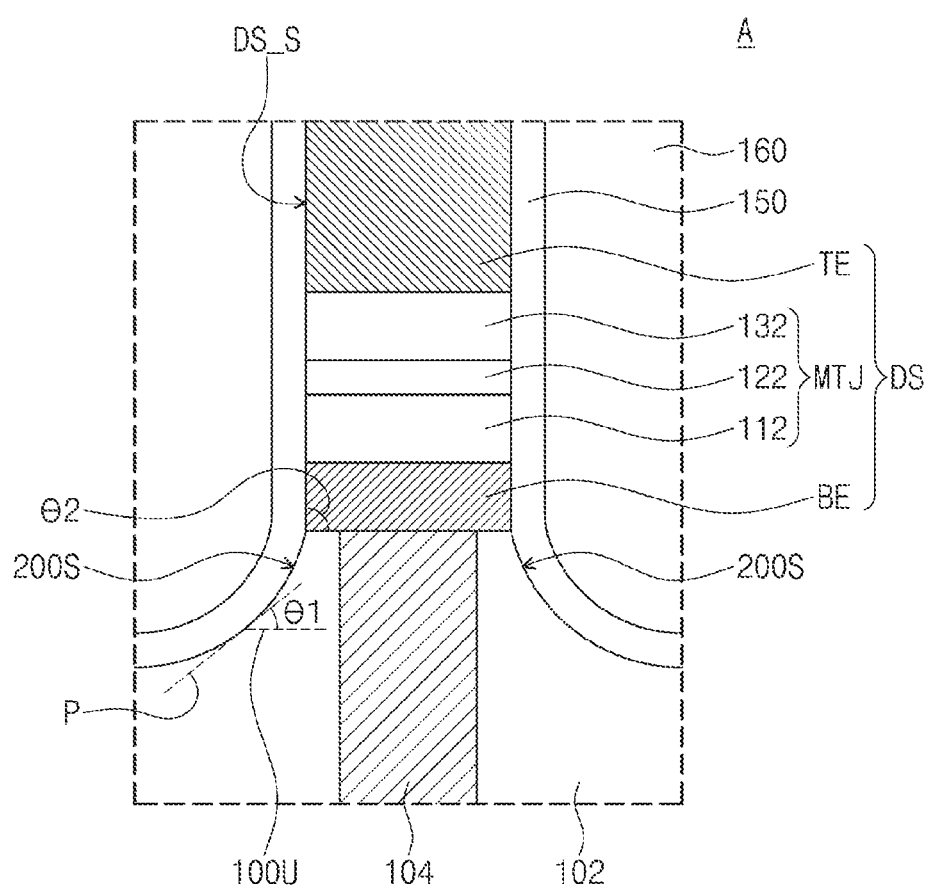
FIG. 5 is an enlarged view of a portion 'A' of FIG. 4.
Figure 6:
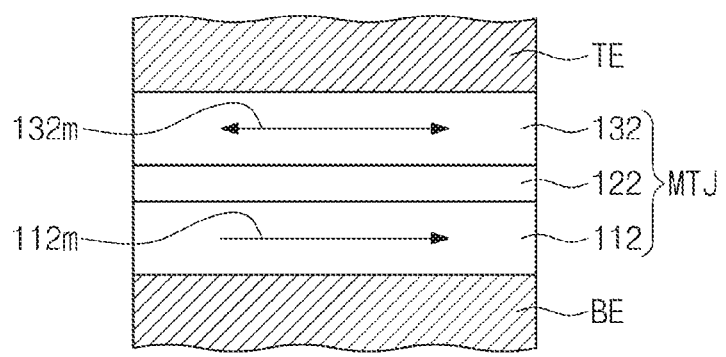
FIGS. 6 and 7 are cross-sectional views illustrating examples of a magnetic tunnel junction pattern of a magnetic memory device according to some example embodiments of the inventive concepts.
Figure 7:
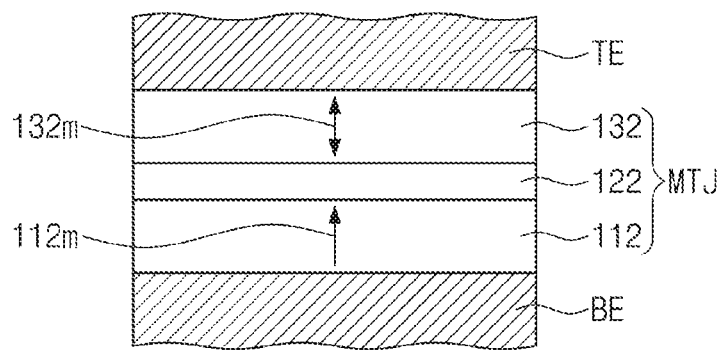

FIG. 3 is a plan view illustrating a magnetic memory device according to some example embodiments of the inventive concepts. FIG. 4 is a cross-sectional view taken along a line I-I' of FIG. 3, and FIG. 5 is an enlarged view of a portion 'A' of FIG. 4. FIGS. 6 and 7 are cross-sectional views illustrating examples of a magnetic tunnel junction pattern of a magnetic memory device according to some example embodiments of the inventive concepts.

Referring to FIGS. 3 and 4, a lower interlayer insulating layer 102 may be provided on ("may be located on," "may be on," etc.) a substrate 100. The substrate 100 may be a semiconductor substrate that includes silicon (Si), silicon on an insulator (SOI), silicon-germanium (SiGe), germanium (Ge), or gallium-arsenic (GaAs). Selection elements (not shown) may be provided on the substrate 100. The selection elements may be field effect transistors or diodes. The lower interlayer insulating layer 102 may cover the selection elements. The lower interlayer insulating layer 102 may include at least one of an oxide, a nitride, or an oxynitride.

Lower contact plugs 104 may be provided in ("may be located in," "may be in," etc.) the lower interlayer insulating layer 102 and may extend through the lower interlayer insulating layer 102 to be connected to the substrate 100. Each of the lower contact plugs 104 may penetrate ("extend through") the lower interlayer insulating layer 102 so as to be electrically connected to one terminal of a corresponding one of the selection elements. The lower contact plugs 104 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide). A top surface 104U of each of the lower contact plugs 104 may be substantially coplanar (e.g., coplanar within manufacturing tolerances and/or material tolerances) with a top surface 102U1 of the lower interlayer insulating layer 102.

Data storage structures DS may be provided on the lower interlayer insulating layer 102. The data storage structures DS may be spaced apart from each other ("isolated from direct contact with each other") in a direction parallel ("direction extending parallel") to a top surface 100U of the substrate 100. The data storage structures DS may be two-dimensionally arranged along a first direction D1 and a second direction D2 intersecting the first direction D1 when viewed in a plan view. The data storage structures DS may be respectively provided on the lower contact plugs 104 and may be respectively connected to the lower contact plugs 104. Each of the data storage structures DS may include a bottom electrode pattern BE, a magnetic tunnel junction pattern MTJ, and a top electrode pattern TE. Thus, where a magnetic memory device includes a plurality of magnetic tunnel junction patterns MTJ, as shown in FIG. 4, for example, a bottom electrode pattern BE may be between each magnetic tunnel junction pattern MTJ and the lower interlayer insulating layer 102, and the top surfaces 104U of each lower contact plug 104 may be in contact with the bottom electrode pattern BE. The bottom electrode pattern BE may be provided between the magnetic tunnel junction pattern MTJ and a corresponding one of the lower contact plugs 104, and the top electrode pattern TE may be spaced apart from the bottom electrode pattern BE with the magnetic tunnel junction pattern MTJ interposed therebetween. The magnetic tunnel junction pattern MTJ may be provided between the bottom electrode pattern BE and the top electrode pattern TE. Thus, as shown in at least FIGS. 3-4, the magnetic memory device may include a plurality of magnetic tunnel junction patterns MTJ on the lower interlayer insulating layer 102, where the plurality of magnetic tunnel junction patterns MTJ are isolated from direct contact from each other in a direction (e.g., a "first plane") extending parallel to a top surface 100U of the substrate 100. The bottom electrode pattern BE may be in contact with the top surface 104U of the corresponding lower contact plug 104.

Thus, the plurality of lower contact plugs 104 may be connected to separate, respective magnetic tunnel junction patterns MTJ of the plurality of magnetic tunnel junction patterns MTJ. The bottom electrode pattern BE may include a conductive metal nitride (e.g., titanium nitride or tantalum nitride), and the top electrode pattern TE may include at least one of a metal (e.g., Ta, W, Ru, or Ir) or a conductive metal nitride (e.g., TiN).

As referred to herein, a direction extending parallel to a top surface 100U of the substrate 100 may be interchangeably referred to herein as a plane (e.g., "first plane," "second plane," or the like) extending parallel to the top surface 100U of the substrate 100. Similarly, a direction extending perpendicular to a top surface 100U of the substrate 100 may be interchangeably referred to herein as a plane extending perpendicular to the top surface 100U of the substrate 100.

The magnetic tunnel junction pattern MTJ may include a first magnetic pattern 112, a second magnetic pattern 132, and a tunnel barrier pattern 122 disposed between the first and second magnetic patterns 112 and 132. The first magnetic pattern 112 may be provided between the bottom electrode pattern BE and the tunnel barrier pattern 122, and the second magnetic pattern 132 may be provided between the top electrode pattern TE and the tunnel barrier pattern 122. For example, the tunnel barrier pattern 122 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the first and second magnetic patterns may include at least one magnetic layer.

Referring to FIGS. 6 and 7, the first magnetic pattern 112 may include a reference layer having a magnetization direction 112m fixed in one direction, and the second magnetic pattern 132 may include a free layer having a magnetization direction 132m changeable to be parallel or anti-parallel to the magnetization direction 112m of the reference layer. FIGS. 6 and 7 illustrate the examples in which the first magnetic pattern 112 includes the reference layer and the second magnetic pattern 132 includes the free layer. However, embodiments of the inventive concepts are not limited thereto. Unlike FIGS. 6 and 7, the first magnetic pattern 112 may include the free layer and the second magnetic pattern 132 may include the reference layer.

In some example embodiments, as illustrated in FIG. 6, the magnetization directions 112m and 132m may be substantially parallel (e.g., parallel within manufacturing tolerances and/or material tolerances) to an interface between the tunnel barrier pattern 122 and the first magnetic pattern 112. In this case, each of the reference layer and the free layer may include a ferromagnetic material. The reference layer may further include an anti-ferromagnetic material for fixing or pinning a magnetization direction of the ferromagnetic material.

In certain embodiments, as illustrated in FIG. 7, the magnetization directions 112m and 132m may be substantially perpendicular (e.g., perpendicular within manufacturing tolerances and/or material tolerances) to the interface between the tunnel barrier pattern 122 and the first magnetic pattern 112. In this case, each of the reference layer and the free layer may include at least one of a perpendicular magnetic material (e.g., CoFeTb, CoFeGd, or CoFeDy), a perpendicular magnetic material having a L10 lattice structure, a CoPt alloy having a hexagonal close packed (HCP) lattice structure, or a perpendicular magnetic structure. The perpendicular magnetic material having the L10 lattice structure may include at least one of FePt having the L10 lattice structure, FePd having the L10 lattice structure, CoPd having the L10 lattice structure, or CoPt having the L10 lattice structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. Here, the reference layer may be thicker than the free layer, and/or a coercive force of the reference layer may be greater than a coercive force of the free layer.

Referring to FIGS. 4 and 5, the lower interlayer insulating layer 102 may include a recess region 200 in which an upper portion of the lower interlayer insulating layer 102 between the magnetic tunnel junction patterns MTJ is recessed. In other words, and as shown in at least FIG. 4, the lower interlayer insulating layer 102 may include a region in which an upper surface 102U of the lower interlayer insulating layer 102 is recessed between adjacent data storage structures, and thus a thickness of the lower interlayer insulating layer 102 in a direction (e.g., "plane") extending perpendicular to the top surface 100U of the substrate 100 is reduced between adjacent data storage structures DS, such that the upper surface 102U of the lower interlayer insulating layer 102 at least partially defines a recess in the lower interlayer insulating layer 102. Such a recess is referred to herein as recess region 200. As shown in at least FIG. 4, the upper surface 102U of the lower interlayer insulating layer 102 includes non-recessed surfaces (top surfaces 102U1) on (e.g., above, beneath, etc.) separate, respective magnetic tunnel junction patterns MTJ and recessed upper surfaces (recessed surfaces 102U2) between adjacent magnetic tunnel junction patterns MTJ. As further shown in FIG. 4, each recessed surface 102U2 of the lower interlayer insulating layer 102, which is a portion of the upper surface 102U of the lower interlayer insulating layer 102 that at least partially defines a recess region 200, may at least partially define an inner sidewall 200S and a bottom surface 200B of the recess region 200. The recess region 200 may have a width W in a direction (e.g., a "second plane") extending parallel to the top surface 100U of the substrate 100. As referred to herein, the "first plane" and the "second plane" may be different, parallel planes. The width W of the recess region 200 may become less as a distance from the substrate 100 in a direction ("plane") extending perpendicular to the top surface 100U of the substrate decreases (i.e. the width W of the recess region 200 may become narrower toward the substrate 100, a magnitude of the width of the recess region 200 in a plane extending parallel to the top surface 100U may be proportional to a distance of the plane from the top surface 100U).

In a cross-sectional view, an inner sidewall 200S of the recess region 200 may be inclined at a first angle θ1 with respect to the top surface 100U of the substrate 100, and the first angle θ1 may be an acute angle. In other words, the first angle θ1 may be greater than 0 degree and less than 90 degrees. As shown in at least FIG. 4, the inner sidewall 200S of the recess region 200 may be a curved surface rounded toward an inside of the lower interlayer insulating layer 102, such that a center of curvature of the inner sidewall 200S is external to (e.g., above) the lower interlayer insulating layer 102 (e.g., within the upper interlayer insulating layer 160). In this case, a gradient P of the inner sidewall 200S of the recess region 200 with respect to the top surface 100U of the substrate 100 (restated, an angular difference between the slope of a portion of the inner sidewall 200S and the slope of the top surface 100U of the substrate 100) may decrease as a distance from the substrate 100 decreases (restated, the angular difference may be proportional to the distance of the portion of the inner sidewall 200S from the top surface 100U of the substrate 100 in a direction ("plane") extending perpendicular to the top surface 100U). In other words, the first angle θ1 of the inner sidewall 200S of the recess region 200 may decrease as a distance from the substrate 100 decreases. A bottom surface 200B of the recess region 200 may be convex toward the top surface 100U of the substrate 100 in a direction ("plane") that is perpendicular to the top surface 100U of the substrate 100. The bottom surface 200B of the recess region 200 may be a curved surface rounded toward the inside of the lower interlayer insulating layer 102.

As referred to herein, multiple and separate references to a "plane" that is or extends perpendicular to the top surface 100U of the substrate may be references to a common plane. The common plane may extend through each of multiple data structures DS and/or magnetic tunnel junction patterns MTJ in a direction that is parallel to a direction in which the multiple data structures DS and/or magnetic tunnel junction patterns MTJ extend.

A sidewall DS_S of each of the data storage structures DS may make a second angle θ2 with the top surface 100U of the substrate 100. The second angle θ2 may be greater than the first angle θ1. In other words, a gradient of the sidewall DS_S of each of the data storage structures DS with respect to the top surface 100U of the substrate 100 may be greater than the gradient P of the inner sidewall 200S of the recess region 200. The second angle θ2 may be, for example, 90 degrees. The sidewall DS_S of each of the data storage structures DS may be substantially perpendicular to the top surface 100U of the substrate 100.

In some example embodiments, including the example embodiments shown in FIG. 4, the sidewall DS_S of each of the data storage structures DS may be continuously connected to the inner sidewall 200S of the recess region 200. In other words, a sidewall of the bottom electrode pattern BE may be continuously connected to the inner sidewall 200S of the recess region 200. Restated, the sidewall of the bottom electrode pattern BE and the inner sidewall 200S may collectively define a continuous surface that omits instantaneous "step-changes" in the position of the surface at any given distance from the top surface 100U of the substrate 100 but may include instantaneous changes in the slope of the surface. In some example embodiments, a slope of the portion of the inner sidewall 200S that is adjacent to the bottom electrode pattern BE may be equal or substantially equal (e.g., equal within manufacturing tolerance and/or material tolerances) to the slope of the sidewall of the bottom electrode pattern BE. For example, the portion of the inner sidewall 200S that is adjacent to the bottom electrode pattern BE may extend perpendicular to the top surface 100U of the substrate 100. The bottom surface 200B of the recess region 200 may be located at a first height H1 from the top surface 100U of the substrate 100. The bottom surface 200B of the recess region 200 may include the lowest surface closest to the substrate 100, and the first height H1 may be a distance from the top surface 100U of the substrate 100 to the lowest surface. The top surface 104U of each of the lower contact plugs 104 may be located at a second height H2 from the top surface 100U of the substrate 100, and the second height H2 may be greater than the first height H1. In other words, the height of the top surface 104U of each of the lower contact plugs 104 from the top surface 100U of the substrate 100 may be higher than the height of the bottom surface 200B of the recess region 200 from the top surface 100U of the substrate 100. Restated, a top surface 104U of each lower contact plug 104 may be distal from the top surface 100U of the substrate 100 in relation to the bottom surface 200B of the recess region 200.

Referring again to FIGS. 3 and 4, a protective layer 150 may be provided on the sidewall DS_S of each of the data storage structures DS. The protective layer 150 may surround the sidewall DS_S of each of the data storage structures DS when viewed in a plan view. Restated, and as shown in FIGS. 3-4, the protective layer 150 may surround the sidewall DS_S of each data storage structure in a plane extending parallel to the top surface 100U of the substrate. The protective layer 150 may cover sidewalls of the bottom electrode pattern BE, the magnetic tunnel junction pattern MTJ and the top electrode pattern TE and may surround the sidewalls of the bottom electrode pattern BE, the magnetic tunnel junction pattern MTJ and the top electrode pattern TE when viewed in a plan view. The protective layer 150 may extend along ("over," "on," etc.) the inner sidewall 200S and the bottom surface 200B of the recess region 200 and may partially fill the recess region 200. The protective layer 150 may include a nitride (e.g., silicon nitride).

An upper interlayer insulating layer 160 may be provided on the lower interlayer insulating layer 102 to cover the data storage structures DS. The upper interlayer insulating layer 160 may cover the bottom electrode pattern BE, the magnetic tunnel junction pattern MTJ and the top electrode pattern TE of each of the data storage structures DS. Thus, the upper interlayer insulating layer 160 may cover the plurality of magnetic tunnel junction patterns MTJ. As shown in at least FIG. 4, the upper interlayer insulating layer 160 may fill a remaining region of the recess region 200 that is not filled by the protective layer 150. The protective layer 150 may be disposed between ("may extend between") the upper interlayer insulating layer 160 and the sidewall DS_S of each of the data storage structures DS (and may extend between the upper interlayer insulating layer 160 and the sidewall of each magnetic tunnel junction pattern MTJ) and may extend between the upper interlayer insulating layer 160 and an inner surface of the recess region 200 (e.g., may extend between the inner sidewall 200S of the recess region 200 and the upper interlayer insulating layer 160 and may further extend between the bottom surface 200B of the recess region 200 and the upper interlayer insulating layer 160). The inner sidewall 200S and the bottom surface 200B of the recess region 200 may be referred to collectively as the inner surface of the recess region 200. The upper interlayer insulating layer 160 may include at least one of an oxide, a nitride, or an oxynitride.

Conductive contacts 170 may be provided on the data storage structures DS, respectively. Each of the conductive contacts 170 may penetrate at least a portion of the upper interlayer insulating layer 160 so as to be connected to the top electrode pattern TE of each of the data storage structures DS. Each of the conductive contacts 170 may be in direct contact with the top electrode pattern TE of each of the data storage structures DS. The conductive contacts 170 may include at least one of a metal (e.g., copper) or a conductive metal nitride.

A conductive line 180 may be provided on the upper interlayer insulating layer 160. The conductive line 180 may extend in the first direction D1 and may be connected in common to the data storage structures DS arranged in the first direction D1. The conductive line 180 may be provided in plurality, and the plurality of conductive lines 180 may be spaced apart from each other in the second direction D2. Each of the data storage structures DS may be connected to a corresponding one of the conductive lines 180 through a corresponding one of the conductive contacts 170. The conductive line 180 may include at least one of a metal (e.g., copper) or a conductive metal nitride. The conductive line 180 may function as a bit line.

Figure 8:
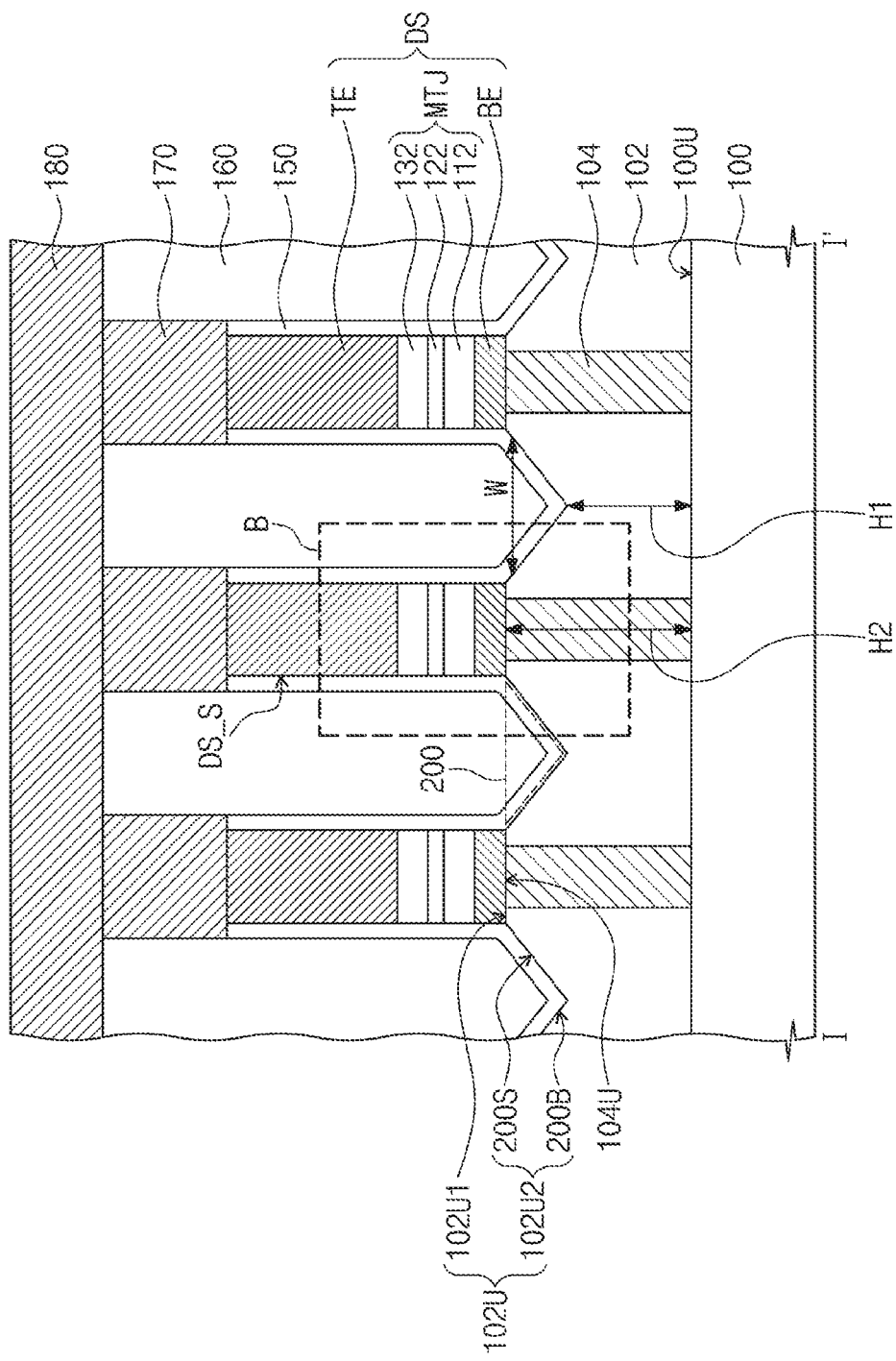
FIG. 8 is a cross-sectional view corresponding to the line I-I' of FIG. 3 to illustrate a magnetic memory device according to some example embodiments of the inventive concepts.
Figure 9:
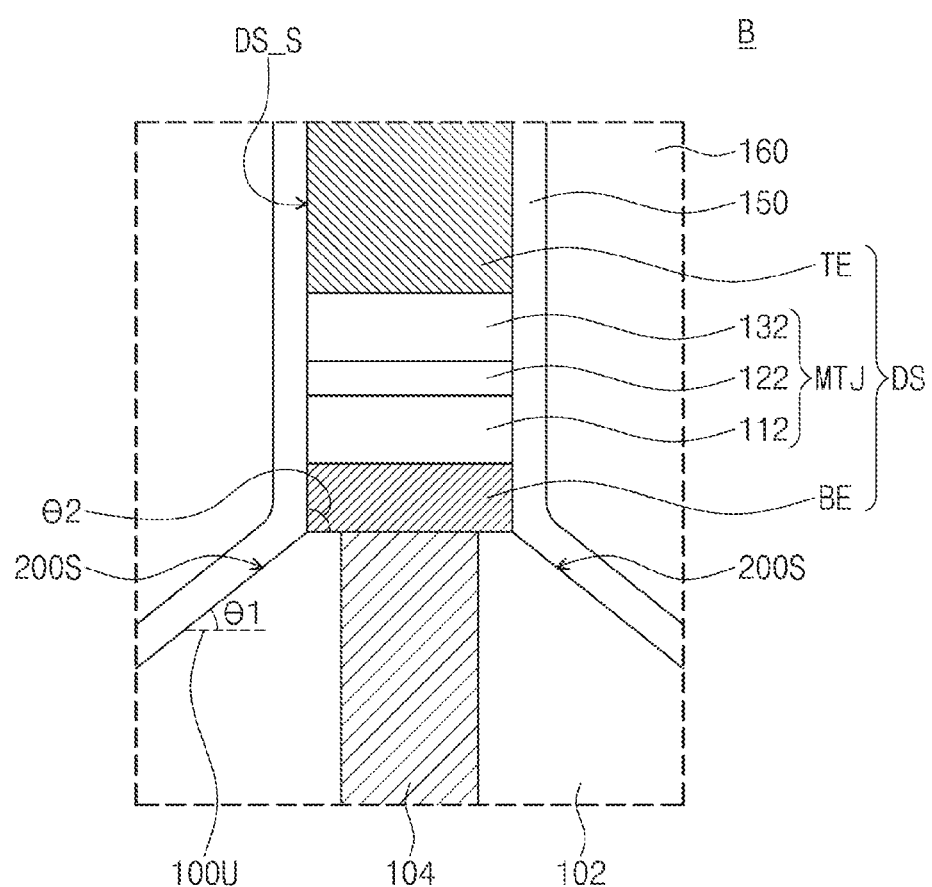
FIG. 9 is an enlarged view of a portion 'B' of FIG. 8.

FIG. 8 is a cross-sectional view corresponding to the line I-I' of FIG. 3 to illustrate a magnetic memory device according to some example embodiments of the inventive concepts. FIG. 9 is an enlarged view of a portion 'B' of FIG. 8. Hereinafter, the descriptions to the same components as in the above embodiments will be omitted or mentioned briefly for the purpose of ease and convenience in explanation.

Referring to FIGS. 8 and 9, the lower interlayer insulating layer 102 may include a recess region 200 in which an upper portion of the lower interlayer insulating layer 102 between the data storage structures DS is recessed. The recess region 200 may have a width W in a direction ("second plane") extending parallel to the top surface 100U of the substrate 100. The width W of the recess region 200 may become less as a distance from the substrate 100 decreases (i.e. the width W of the recess region 200 may become narrower toward the substrate 100). The recess region 200 may have a shape tapered toward the substrate 100.

In a cross-sectional view, an inner sidewall 200S of the recess region 200 may be inclined at the first angle θ1 with respect to the top surface 100U of the substrate 100. In some example embodiments, the inner sidewall 200S of the recess region 200 may be a flat surface which is inclined at the first angle θ1 with respect to the top surface 100U of the substrate 100. However, embodiments of the inventive concepts are not limited thereto. The inner sidewall 200S of the recess region 200 may be the curved surface rounded toward the inside of the lower interlayer insulating layer 102, as described with reference to FIG. 5. In this case, the gradient P of the inner sidewall 200S of the recess region 200 with respect to the top surface 100U of the substrate 100 may decrease as a distance from the substrate 100 decreases. In other words, the first angle θ1 of the inner sidewall 200S of the recess region 200 may decrease as a distance from the substrate 100 decreases. The bottom surface 200B of the recess region 200 may be convex toward the top surface 100U of the substrate 100. The bottom surface 200B of the recess region 200 may have a shape tapered toward the inside of the lower interlayer insulating layer 102.

The sidewall DS_S of each of the data storage structures DS may make the second angle θ2 with the top surface 100U of the substrate 100. The second angle θ2 may be greater than the first angle θ1. In other words, a gradient of the sidewall DS_S of each of the data storage structures DS with respect to the top surface 100U of the substrate 100 may be greater than the gradient P of the inner sidewall 200S of the recess region 200. For example, as shown in at least FIGS. 4 and 8, the sidewall DS_S of each of the data storage structures DS may be substantially perpendicular to the top surface 100U of the substrate 100 (e.g., may have a fixed gradient of 90 degrees in relation to the top surface 100U) and the inner sidewall 200S may have a gradient that is fixed at a magnitude that is less than 90 degrees in relation to the top surface 100U or varies between 0 degrees and a magnitude that is less than 90 degrees in relation to the top surface 100U. Thus, as shown in at least FIGS. 4 and 8, the gradient of a sidewall DS_S of each data storage structure DS with respect to the top surface 100U of the substrate 100 may be greater than a maximum gradient of the inner sidewall 200S of the recess region 200 with respect to the top surface 100U of the substrate 100.

The sidewall DS_S of each of the data storage structures DS may be continuously connected to the inner sidewall 200S of the recess region 200. The bottom surface 200B of the recess region 200 may be located at the first height H1 from the top surface 100U of the substrate 100. When the bottom surface 200B of the recess region 200 has the tapered shape, the bottom surface 200B of the recess region 200 may include the lowest point closest to the substrate 100, and the first height H1 may be a distance from the top surface 100U of the substrate 100 to the lowest point. The top surface 104U of each of the lower contact plugs 104 may be located at the second height H2 from the top surface 100U of the substrate 100, and the second height H2 may be greater than the first height H1. In other words, the height of the top surface 104U of each of the lower contact plugs 104 from the top surface 100U of the substrate 100 may be higher than the height of the bottom surface 200B of the recess region 200 from the top surface 100U of the substrate 100.

Except for the features described above, other features of the magnetic memory device according to some example embodiments may be substantially the same (e.g., the same within manufacturing tolerances and/or material tolerances) as corresponding features of the magnetic memory device described with reference to FIGS. 3 to 7.

Figure 10:
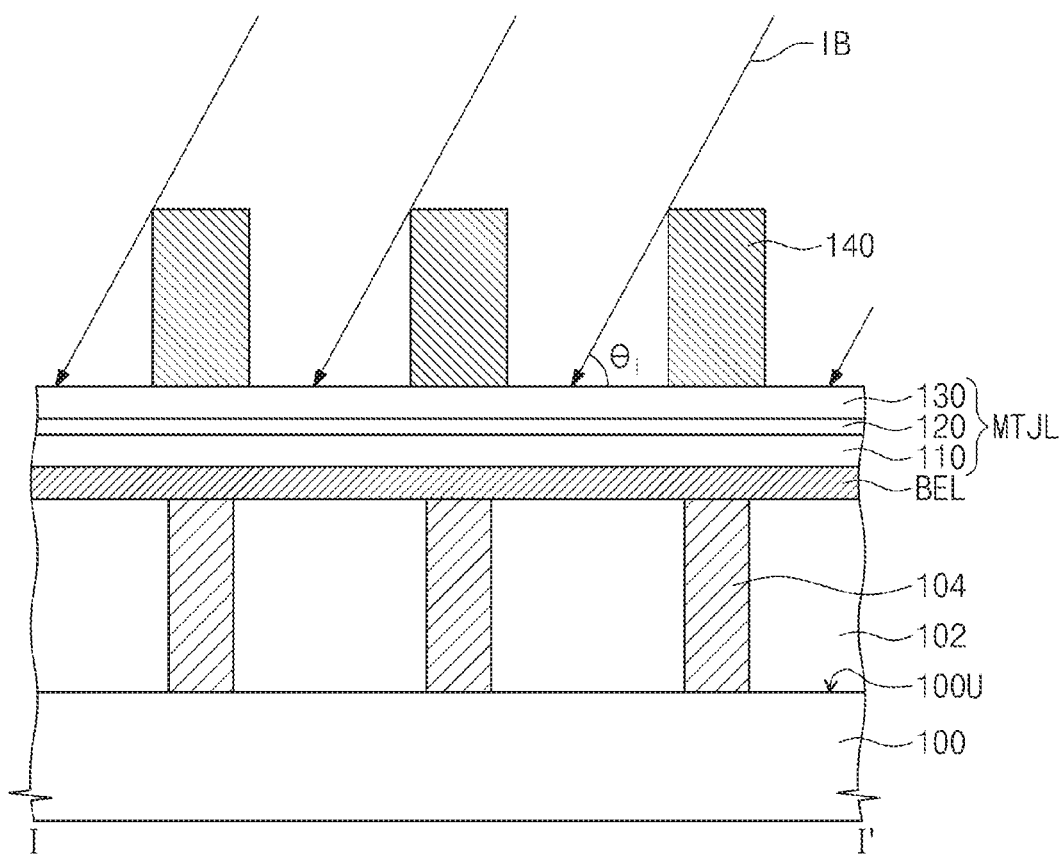
FIGS. 10, 11 and 14 are cross-sectional views corresponding to the line I-I' of FIG. 3 to illustrate a method of manufacturing a magnetic memory device according to some example embodiments of the inventive concepts.
Figure 11:
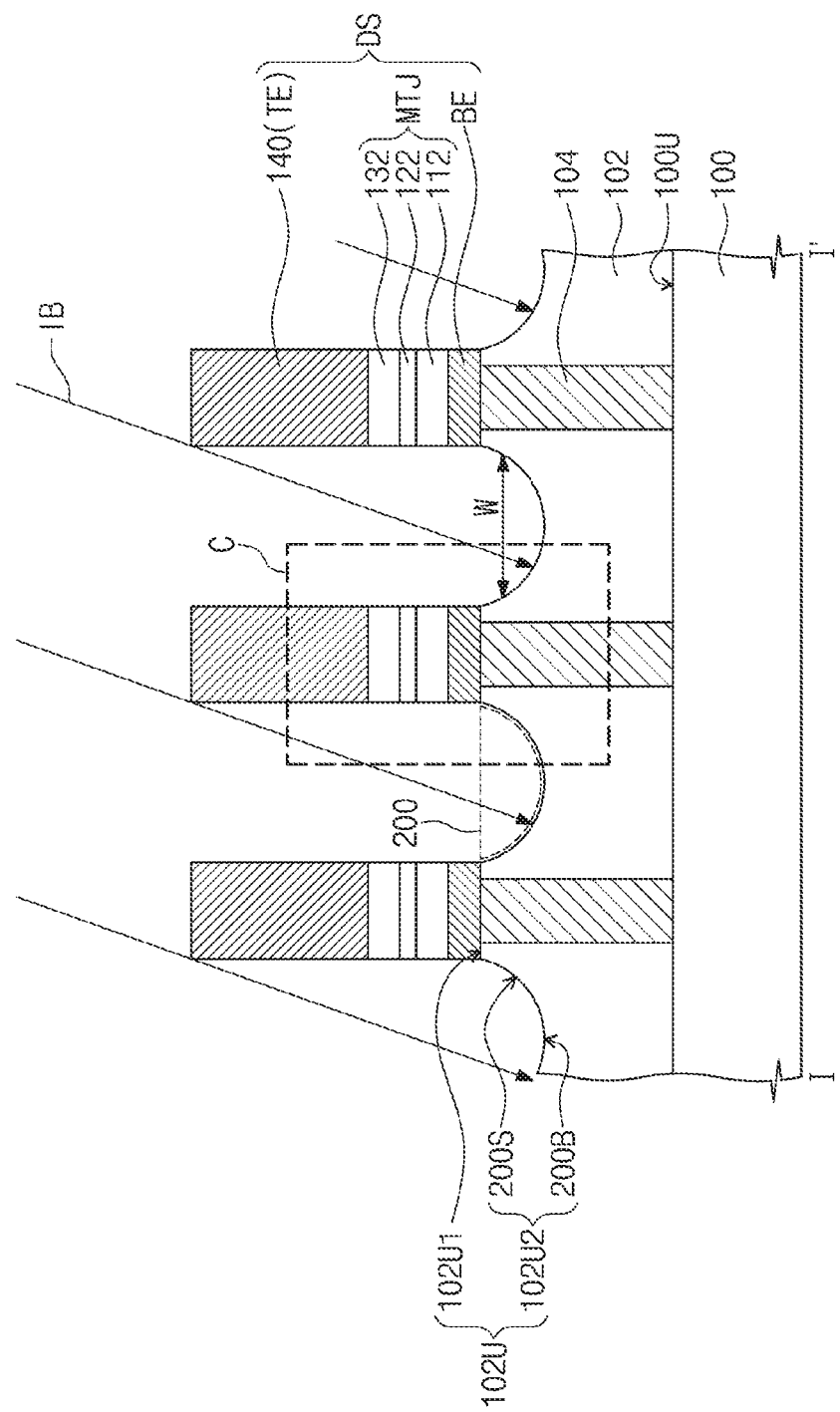
Figure 12:
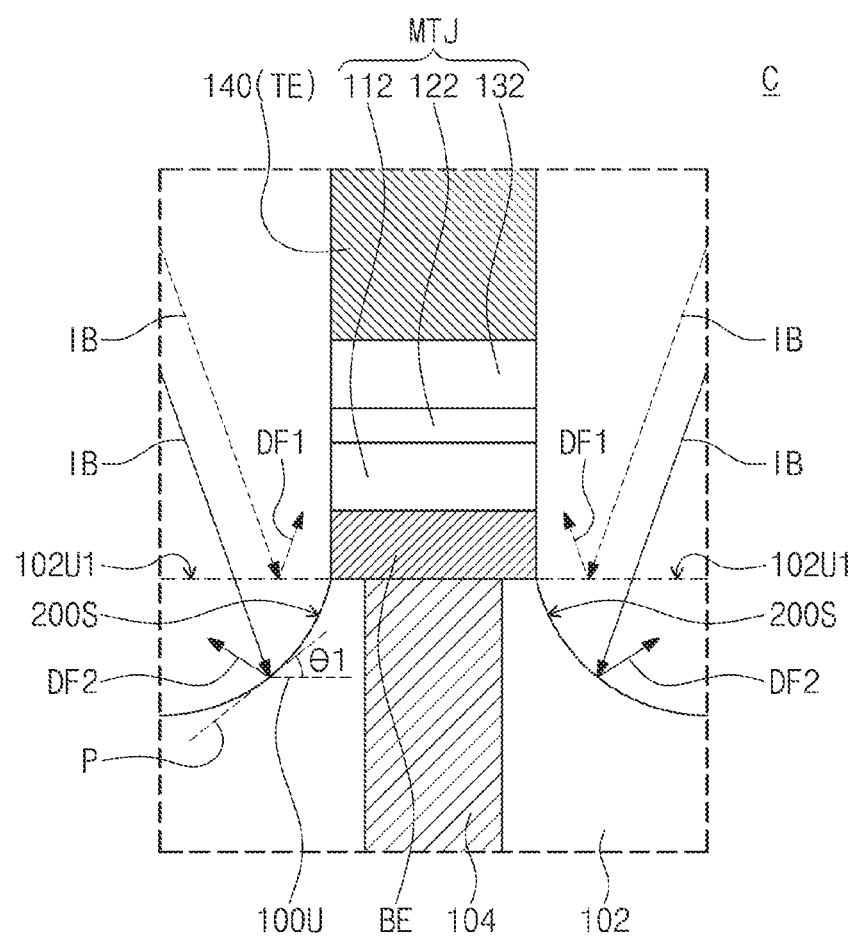
FIGS. 12 and 13 are enlarged views of a portion 'C' of FIG. 11.
Figure 13:
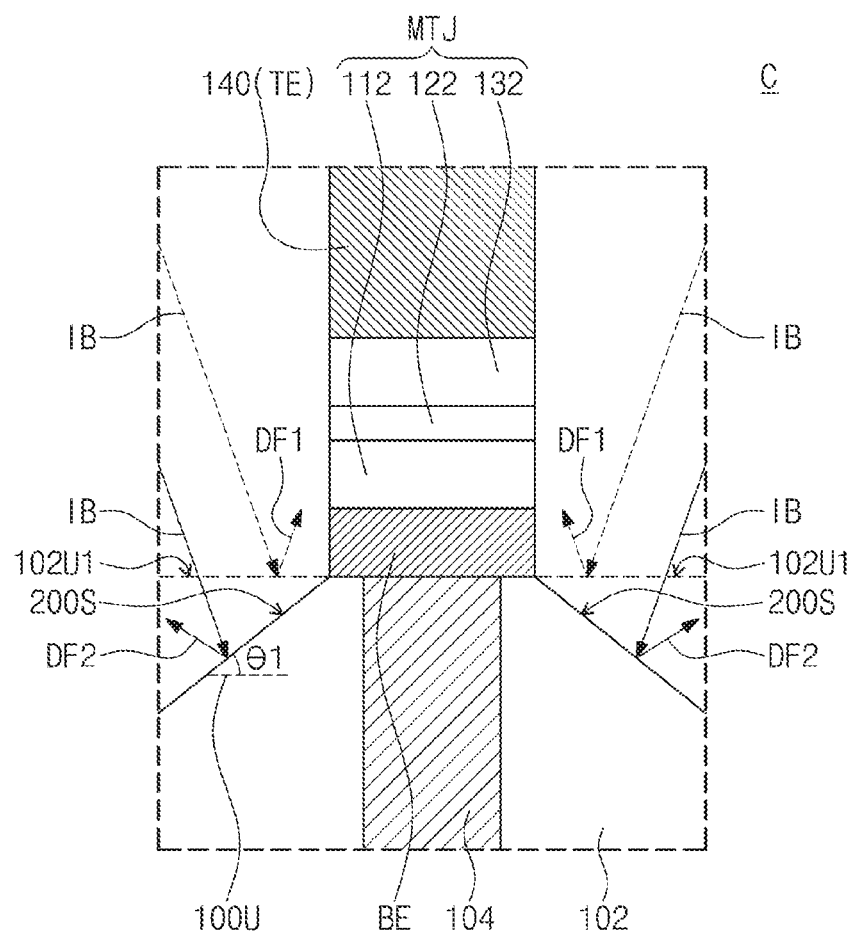
Figure 14:
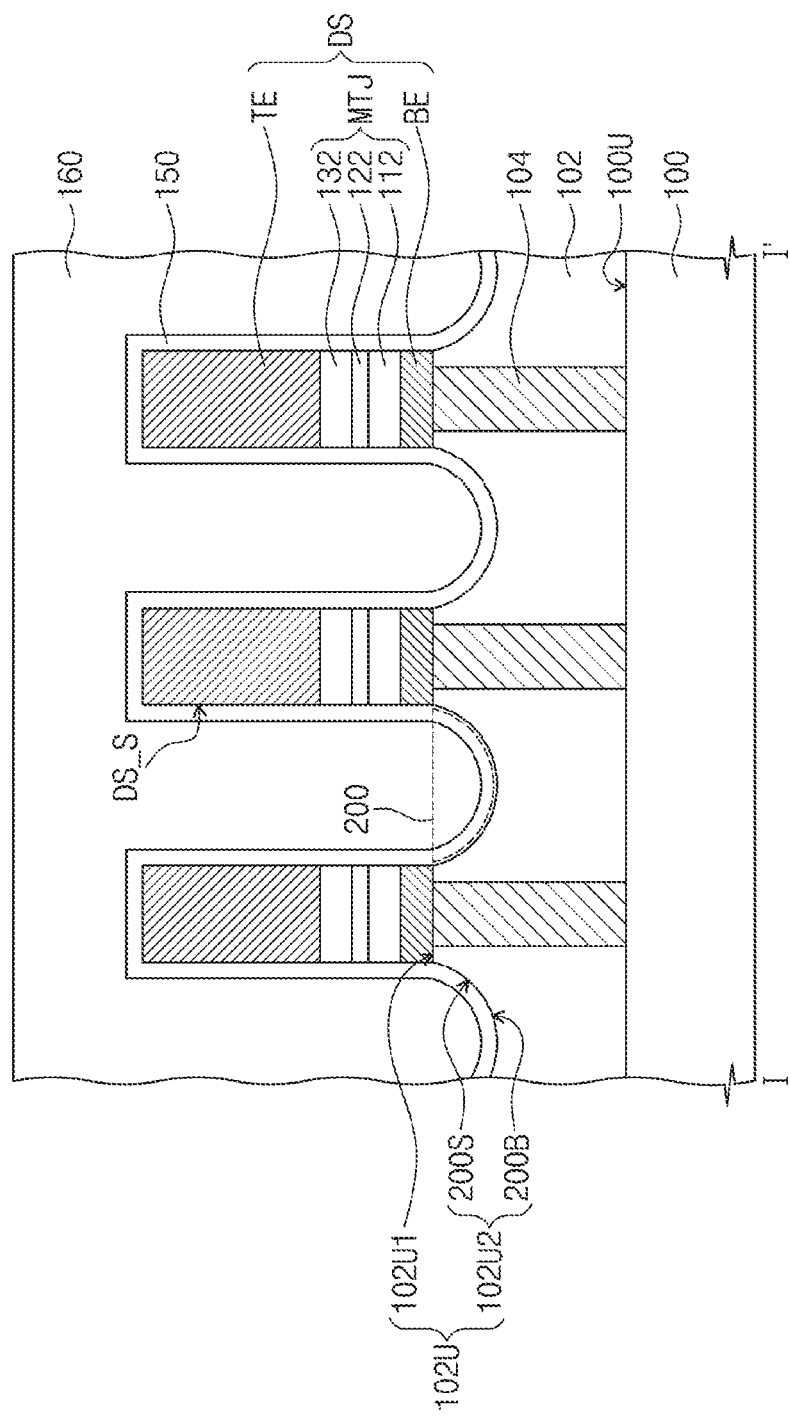

FIGS. 10, 11 and 14 are cross-sectional views corresponding to the line I-I' of FIG. 3 to illustrate a method of manufacturing a magnetic memory device according to some example embodiments of the inventive concepts. FIGS. 12 and 13 are enlarged views of a portion 'C' of FIG. 11.

Referring to FIG. 10, a lower interlayer insulating layer 102 may be formed on a substrate 100. Selection elements (not shown) may be formed on the substrate 100, and the lower interlayer insulating layer 102 may be formed to cover the selection elements. Lower contact plugs 104 may be formed in the lower interlayer insulating layer 102. In some example embodiments, the formation of the lower contact plugs 104 may include forming lower contact holes penetrating the lower interlayer insulating layer 102, and forming the lower contact plugs 104 in the lower contact holes, respectively. Each of the lower contact plugs 104 may be connected to one terminal of a corresponding one of the selection elements.

A bottom electrode layer BEL and a magnetic tunnel junction layer MTJL may be sequentially formed on the lower interlayer insulating layer 102. For example, the bottom electrode layer BEL may include a conductive metal nitride (e.g., titanium nitride or tantalum nitride). The bottom electrode layer BEL may be formed by a sputtering process, a chemical vapor deposition (CVD) process, or an atomic layer deposition (ALD) process. The magnetic tunnel junction layer MTJL may include a first magnetic layer 110, a tunnel barrier layer 120 and a second magnetic layer 130 which are sequentially stacked on the bottom electrode layer BEL. Each of the first and second magnetic layers 110 and 130 may include at least one magnetic layer. The tunnel barrier layer 120 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the first magnetic layer 110, the tunnel barrier layer 120 and the second magnetic layer 130 may be formed by a physical vapor deposition (PVD) process (e.g., a sputtering process) or a CVD process.

Conductive mask patterns 140 may be formed on the magnetic tunnel junction layer MTJL. The conductive mask patterns 140 may define regions in which magnetic tunnel junction patterns will be formed. For example, the conductive mask patterns 140 may include at least one of a metal (e.g., Ta, W, Ru, or Ir) or a conductive metal nitride (e.g., TiN). Thereafter, an ion beam etching process may be performed using the conductive mask patterns 140 as etch masks. The ion beam etching process may be performed by irradiating an ion beam IB onto the substrate 100. The ion beam IB may be irradiated to be tilted at a particular (or, alternatively, predetermined) angle θi with respect to a top surface 100U of the substrate 100. The ion beam IB may include inert ions (e.g., argon positive ions (Ar+)). During the ion beam etching process, the substrate 100 may rotate on a rotation axis perpendicular to the top surface 100U of the substrate 100.

Referring to FIG. 11, the magnetic tunnel junction layer MTJL and the bottom electrode layer BEL may be sequentially patterned by the ion beam etching process using the conductive mask patterns 140 as etch masks. Thus, magnetic tunnel junction patterns MTJ and bottom electrode patterns BE may be formed on the lower interlayer insulating layer 102. The bottom electrode patterns BE may be provided on the lower interlayer insulating layer 102 and may be connected to the lower contact plugs 104, respectively. The magnetic tunnel junction patterns MTJ may be formed on the bottom electrode patterns BE, respectively. Each of the magnetic tunnel junction patterns MTJ may include a first magnetic pattern 112, a tunnel barrier pattern 122 and a second magnetic pattern 132, which are sequentially stacked on each of the bottom electrode patterns BE. The first magnetic pattern 112 and the second magnetic pattern 132 may be spaced apart from each other with the tunnel barrier pattern 122 interposed therebetween.

Referring to FIGS. 11, 12 and 13, the ion beam etching process may be performed to recess an upper portion of the lower interlayer insulating layer 102 between the magnetic tunnel junction patterns MTJ. Thus, a recess region 200 may be formed in the lower interlayer insulating layer 102. The recess region 200 may be formed to have a width W which decreases as a distance from the substrate 100 decreases. In certain embodiments, the recess region 200 may be formed to have a shape tapered toward the substrate 100.

The recess region 200 may be formed such that an inner sidewall 200S of the recess region 200 is inclined at a first angle θ1 with respect to the top surface 100U of the substrate 100 when viewed in a cross-sectional view. The first angle θ1 may be greater than 0 degree and less than 90 degrees. In some example embodiments, as illustrated in FIG. 12, the inner sidewall 200S of the recess region 200 may be formed to be rounded toward an inside of the lower interlayer insulating layer 102. In this case, a gradient P of the inner sidewall 200S of the recess region 200 with respect to the top surface 100U of the substrate 100 may decrease as a distance from the substrate 100 decreases. In other words, the first angle θ1 of the inner sidewall 200S of the recess region 200 may decrease as a distance from the substrate 100 decreases. In certain embodiments, as illustrated in FIG. 13, the inner sidewall 200S of the recess region 200 may be formed in a flat surface shape which is inclined at the first angle θ1 with respect to the top surface 100U of the substrate 100.

The recess region 200 may be formed such that a bottom surface 200B of the recess region 200 is convex toward the top surface 100U of the substrate 100 when viewed in a cross-sectional view. In some example embodiments, the bottom surface 200B of the recess region 200 may be formed to be rounded toward an inside of the lower interlayer insulating layer 102. In certain embodiments, as described with reference to FIG. 8, the bottom surface 200B of the recess region 200 may be formed to be tapered toward the inside of the lower interlayer insulating layer 102.

A conductive etching by-product may generate during the ion beam etching process. If the recess region 200 is not formed in the lower interlayer insulating layer 102 between the magnetic tunnel junction patterns MTJ, the conductive etching by-product may be deposited on a top surface 102U1 of the lower interlayer insulating layer 102 between the magnetic tunnel junction patterns MTJ. In this case, the top surface 102U1 of the lower interlayer insulating layer 102 may be substantially parallel to the top surface 100U of the substrate 100. During the ion beam etching process, the ion beam IB may be irradiated to be tilted with respect to the top surface 102U1 of the lower interlayer insulating layer 102. In this case, the conductive etching by-product on the top surface 102U1 of the lower interlayer insulating layer 102 may be re-sputtered by the ion beam IB, and the re-sputtered conductive etching by-product may be diffused toward the magnetic tunnel junction patterns MTJ (see a reference designator DF1). Thus, the re-sputtered conductive etching by-product may be re-deposited on a sidewall of each of the magnetic tunnel junction patterns MTJ. The re-deposited conductive etching by-product may cause an electrical short between the first magnetic pattern 112 and the second magnetic pattern 132.

According to the inventive concepts, the recess region 200 may be formed in the lower interlayer insulating layer 102 between the magnetic tunnel junction patterns MTJ. The inner sidewall 200S of the recess region 200 may be inclined at the first angle θ1 with respect to the top surface 100U of the substrate 100 when viewed in a cross-sectional view. The conductive etching by-product may be deposited on the inner sidewall 200S of the recess region 200. In this case, the conductive etching by-product on the inner sidewall 200S of the recess region 200 may be re-sputtered by the ion beam IB. However, since the inner sidewall 200S of the recess region 200 is inclined with respect to the top surface 100U of the substrate 100, the re-sputtered conductive etching by-product may be diffused in a direction away from the magnetic tunnel junction patterns MTJ (see a reference designator DF2). Thus, it is possible to inhibit or prevent the re-sputtered conductive etching by-product from being re-deposited on the sidewall of each of the magnetic tunnel junction patterns MTJ. As a result, an electrical short between the first and second magnetic patterns 112 and 132 may be inhibited or prevented.

Referring again to FIG. 11, at least a portion of each of the conductive mask patterns 140 may remain on each of the magnetic tunnel junction patterns MTJ after the ion beam etching process. The remaining conductive mask patterns 140 may function as top electrodes. Hereinafter, the remaining conductive mask patterns 140 are referred to top electrode patterns TE. The bottom electrode pattern BE, the magnetic tunnel junction pattern MTJ and the top electrode pattern TE, which are sequentially stacked, such that the bottom electrode pattern BE is on the lower interlayer insulating layer 102, the magnetic tunnel junction pattern MTJ is on the bottom electrode pattern BE, and the top electrode pattern TE is on the magnetic tunnel junction pattern MTJ, may constitute a data storage structure DS.

Referring to FIG. 14, a sidewall DS_S of the data storage structure DS may be formed to be substantially perpendicular to the top surface 100U of the substrate 100, by the ion beam etching process. A protective layer 150 may be formed on the lower interlayer insulating layer 102 to cover a plurality of the data storage structures DS. The protective layer 150 may be formed to conformally cover the sidewalls DS_S of the data storage structures DS and may extend onto top surfaces of the data storage structures DS. The protective layer 150 may be formed to partially fill the recess region 200 between the data storage structures DS. The protective layer 150 may extend along the inner sidewall 200S and the bottom surface 200B of the recess region 200.

An upper interlayer insulating layer 160 may be formed on the lower interlayer insulating layer 102 to cover the data storage structures DS and the protective layer 150. The upper interlayer insulating layer 160 may be formed to fill a remaining region of the recess region 200 between the data storage structures DS. The protective layer 150 may be disposed between the sidewall DS_S of the data storage structure DS and the upper interlayer insulating layer 160 and between the top surface of the data storage structure DS and the upper interlayer insulating layer 160. The protective layer 150 may extend between an inner surface of the recess region 200 and the upper interlayer insulating layer 160. The inner sidewall 200S and the bottom surface 200B of the recess region 200 may be referred to the inner surface of the recess region 200.

Referring to FIG. 4, conductive contacts 170 may be formed in the upper interlayer insulating layer 160. Each of the conductive contacts 170 may penetrate a portion of the upper interlayer insulating layer 160 and a portion of the protective layer 150 so as to be connected to each of the top electrode patterns TE. The formation of the conductive contacts 170 may include forming contact holes which penetrate the upper interlayer insulating layer 160 and the protective layer 150 to expose the top electrode patterns TE, respectively, forming a conductive layer filling the contact holes on the upper interlayer insulating layer 160, and planarizing the conductive layer until the upper interlayer insulating layer 160 is exposed. A conductive line 180 may be formed on the upper interlayer insulating layer 160. The data storage structure DS may be connected to the conductive line 180 through a corresponding one of the conductive contacts 170.

According to the inventive concepts, the recess region 200 may be formed in the lower interlayer insulating layer 102 between the magnetic tunnel junction patterns MTJ, and the inner sidewall 200S of the recess region 200 may be formed to be inclined at the first angle θ1 with respect to the top surface 100U of the substrate 100 when viewed in a cross-sectional view. Thus, when the conductive etching by-product on the inner sidewall 200S of the recess region 200 is re-sputtered in the ion beam etching process, the re-sputtered conductive etching by-product may be diffused in a direction away from the magnetic tunnel junction patterns MTJ. As a result, an electrical short of the magnetic tunnel junction pattern MTJ may be inhibited or prevented, and thus it is possible to improve electrical characteristics of the magnetic memory device including the magnetic tunnel junction patterns MTJ.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device, comprising:
    a lower interlayer insulating layer on a substrate; and
    a plurality of magnetic tunnel junction patterns on the lower interlayer insulating layer, the plurality of magnetic tunnel junction patterns isolated from direct contact with each other in a first plane extending parallel to a top surface of the substrate,
    wherein the lower interlayer insulating layer includes an upper surface, the upper surface of the lower interlayer insulating layer including a recessed surface and a top surface, the recessed surface at least partially defining an inner sidewall and a bottom surface of a recess region in the lower interlayer insulating layer between adjacent magnetic tunnel junction patterns of the plurality of magnetic tunnel junction patterns, such that the recessed surface at least partially defines the recess region,
    wherein the inner sidewall of the recess region is inclined at an acute angle with respect to the top surface of the substrate, and the bottom surface of the recess region has a shape that is convex toward the top surface of the substrate, in a plane extending perpendicular to the top surface of the substrate.

2. The magnetic memory device of claim 1, wherein the recess region has a width in a second plane extending parallel to the top surface of the substrate, and a magnitude of the width of the recess region is proportional to a distance of the second plane from the substrate.

3. The magnetic memory device of claim 1, wherein the inner sidewall of the recess region is a curved surface rounded toward an inside of the lower interlayer insulating layer, such that a center of curvature of the inner sidewall is external to the lower interlayer insulating layer.

4. The magnetic memory device of claim 1, wherein a gradient of the inner sidewall of the recess region with respect to the top surface of the substrate is proportional to a distance between the inner sidewall and the top surface of the substrate in the plane extending perpendicular to the top surface of the substrate.

5. The magnetic memory device of claim 1, further comprising:
    a bottom electrode pattern between each magnetic tunnel junction pattern of the plurality of magnetic tunnel junction patterns and the lower interlayer insulating layer,
    wherein a sidewall of the bottom electrode pattern is continuously connected to the inner sidewall of the recess region.

6. The magnetic memory device of claim 1, further comprising:
    a protective layer on a sidewall of each magnetic tunnel junction pattern of the plurality of magnetic tunnel junction patterns,
    wherein the protective layer extends on the inner sidewall and the bottom surface of the recess region and partially fill the recess region.

7. The magnetic memory device of claim 6, wherein the protective layer surrounds the sidewall of each magnetic tunnel junction pattern of the plurality of magnetic tunnel junction patterns in the first plane extending parallel to the top surface of the substrate.

8. The magnetic memory device of claim 6, further comprising:
    an upper interlayer insulating layer on the lower interlayer insulating layer, the upper interlayer insulating layer covering the plurality of magnetic tunnel junction patterns, wherein the upper interlayer insulating layer fills a remaining region of the recess region that is not filled by the protective layer, and wherein the protective layer extends between the sidewall of each magnetic tunnel junction pattern of the plurality of magnetic tunnel junction patterns and the upper interlayer insulating layer, the protective layer further extends between the inner sidewall of the recess region and the upper interlayer insulating layer, and the protective layer further extends between the bottom surface of the recess region and the upper interlayer insulating layer.

9. The magnetic memory device of claim 1, wherein the shape of the bottom surface of the recess region is tapered toward the top surface of the substrate.

10. The magnetic memory device of claim 1, further comprising:

a plurality of lower contact plugs in the lower interlayer insulating layer, the plurality of lower contact plugs connected to separate, respective magnetic tunnel junction patterns of the plurality of magnetic tunnel junction patterns, wherein each lower contact plug of the plurality of lower contact plugs extends through the lower interlayer insulating layer to be connected to the substrate, and wherein a top surface of each lower contact plug of the plurality of lower contact plugs is distal from the top surface of the substrate in relation to the bottom surface of the recess region.

11. The magnetic memory device of claim 10, further comprising:

a bottom electrode pattern between each magnetic tunnel junction pattern of the plurality of magnetic tunnel junction patterns and the lower interlayer insulating layer, wherein the top surface of each lower contact plug of the plurality of lower contact plugs is in contact with the bottom electrode pattern.

12. A magnetic memory device comprising:

a lower interlayer insulating layer on a substrate; and a plurality of data storage structures on the lower interlayer insulating layer, the plurality of data storage structures isolated from direct contact with each other in a first plane extending parallel to a top surface of the substrate, wherein each data storage structure of the plurality of data storage structures includes a bottom electrode pattern on the lower interlayer insulating layer, a magnetic tunnel junction pattern on the bottom electrode pattern, and a top electrode pattern on the magnetic tunnel junction pattern, wherein the lower interlayer insulating layer includes an upper surface, the upper surface of the lower interlayer insulating layer including a recessed surface and a top surface, the recessed surface at least partially defining an inner sidewall and a bottom surface of a recess region in the lower interlayer insulating layer between adjacent data storage structures of the plurality of data storage structures, such that the recessed surface at least partially defines the recess region, wherein the inner sidewall of the recess region is inclined at an acute angle with respect to the top surface of the substrate, and the bottom surface of the recess region has a shape that is convex toward the top surface of the substrate, in a plane extending perpendicular to the top surface of the substrate.

13. The magnetic memory device of claim 12, wherein a sidewall of each data storage structure of the plurality of data storage structures is continuously connected to the inner sidewall of the recess region.

14. The magnetic memory device of claim 13, wherein the inner sidewall of the recess region is a curved surface rounded toward an inside of the lower interlayer insulating layer, such that a center of curvature of the inner sidewall is external to the lower interlayer insulating layer.

15. The magnetic memory device of claim 13, wherein a gradient of the inner sidewall of the recess region with respect to the top surface of the substrate is proportional to a distance between the inner sidewall and the top surface of the substrate in the plane extending perpendicular to the top surface of the substrate.

16. The magnetic memory device of claim 13, wherein the shape of the bottom surface of the recess region is tapered toward the top surface of the substrate.

17. The magnetic memory device of claim 13, further comprising:

a protective layer on the sidewall of each data storage structure of the plurality of data storage structures, wherein the protective layer extends on the inner sidewall and the bottom surface of the recess region and partially fill the recess region.

18. The magnetic memory device of claim 17, further comprising:

an upper interlayer insulating layer on the lower interlayer insulating layer, the upper interlayer insulating layer covering the plurality of data storage structures, wherein the upper interlayer insulating layer fills a remaining region of the recess region that is not filled by the protective layer, and wherein the protective layer extends between the sidewall of each data storage structure of the plurality of data storage structures and the upper interlayer insulating layer, the protective layer further extends between the inner sidewall of the recess region and the upper interlayer insulating layer, the protective layer further extends between the bottom surface of the recess region and the upper interlayer insulating layer.

19. The magnetic memory device of claim 12, wherein the recess region has a width in a second plane extending parallel to the top surface of the substrate, and a magnitude of the width of the recess region is proportional to a distance of the plane from the substrate.

20. The magnetic memory device of claim 19, wherein a gradient of a sidewall of each data storage structure of the plurality of data storage structures with respect to the top surface of the substrate is greater than a maximum gradient of the inner sidewall of the recess region with respect to the top surface of the substrate, in the plane extending perpendicular to the top surface of the substrate.

* * * * *